United States Patent
Yedur et al.

(10) Patent No.: US 7,639,375 B2
(45) Date of Patent: Dec. 29, 2009

(54) DETERMINING TRANSMITTANCE OF A PHOTOMASK USING OPTICAL METROLOGY

(75) Inventors: Sanjay Yedur, Fremont, CA (US); Shifang Li, Pleasanton, CA (US); Youxian Wen, Fremont, CA (US); Wei Liu, Santa Clara, CA (US); Hanyou Chu, Palo Alto, CA (US); Ying Ying Luo, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 193 days.

(21) Appl. No.: 11/639,974

(22) Filed: Dec. 14, 2006

(65) Prior Publication Data

US 2008/0144919 A1    Jun. 19, 2008

(51) Int. Cl.
 *G01B 11/14* (2006.01)
(52) U.S. Cl. ...................... 356/625; 356/632
(58) Field of Classification Search ......... 356/625–640, 356/328, 601–604; 382/144; 702/57, 66, 702/81, 155, 166, 189; 250/559.22
See application file for complete search history.

(56) References Cited

U.S. PATENT DOCUMENTS

| | | | |
|---|---|---|---|
| 6,785,638 B2 | 8/2004 | Niu et al. | |
| 6,891,626 B2 | 5/2005 | Niu et al. | |
| 6,943,900 B2 | 9/2005 | Niu et al. | |
| 2002/0066859 A1* | 6/2002 | Ino et al. | 250/339.04 |
| 2004/0267397 A1 | 12/2004 | Doddi et al. | |
| 2006/0066844 A1* | 3/2006 | Moribe et al. | 356/237.5 |

OTHER PUBLICATIONS

"Stable Implementation of the rigorous coupled-wave analysis for surface-relief gratings: enhanced transmittance matrix approach", J Opt. Soc. Am. A, pp. 1077-1086, vol. 12, No. 5, May 1995.*
Haykin, S. (1999). *Neural Networks*. 2nd edition, M. Horton ed., Prentice Hall: Upper Saddle River, New Jersey, 9 pages (Table of Contents).
Li, L. (Apr. 2003). "Note on the S-Matrix Propagation Algorithm," *Journal of the Optical Society of America A* 20(4):655-660.

* cited by examiner

*Primary Examiner*—Gregory J Toatley, Jr.
*Assistant Examiner*—Tri T Ton
(74) *Attorney, Agent, or Firm*—Manuel B. Madriaga

(57) ABSTRACT

Transmittance of a photomask is determined using optical metrology. In particular, reflectance of a portion of the photomask is determined by directing an incident beam of light at the portion of the photomask. The reflectance is determined by measuring light diffracted from the portion of the photomask. One or more geometric features of the portion of the photomask are determined using the measured light diffracted from the portion of the photomask. A wave coupling is determined using the determined one or more geometric features of the portion of the photomask. The transmittance of the photomask is determined using the determined wave coupling and the determined reflectance of the portion of the photomask.

20 Claims, 2 Drawing Sheets

DETERMINING TRANSMITTANCE OF A PHOTOMASK USING OPTICAL METROLOGY

BACKGROUND

1. Field

The present application generally relates to optical metrology, and, more particularly, to determining transmittance of a photomask using optical metrology.

2. Description of the Related Art

Semiconductor devices/circuits are formed on semiconductor wafers by depositing and patterning layers of materials. In general, the features of the devices/circuits are formed onto the layers of deposited materials using a lithography process.

In a typical lithography process, the features of the devices/circuits are laid out, one layer at a time, on a series of photomasks. The layout of the features of the devices/circuits on the photomasks are transferred, one photomask at a time, onto the deposited layers of materials. A single photomask typically includes the layout for one layer of one or more chips throughout the wafer.

For example, with reference to FIG. 1, a photoresist layer 100 is deposited on wafer 102. Photomask 104 is positioned above photoresist layer 100. Photomask 104 includes portions 106 that block light and portions 108 that transmit light. Portions 106 of photomask 104 that block light can be patterned to have the same shape as the features that are to be formed on photoresist layer 100. These types of photomasks are generally referred to as "light field" photomasks. Alternatively, portions 108 of photomask 104 that transmit light can be patterned to have the same shape as the features that are to be formed on photoresist layer 100. These types of photomasks are generally referred to as "dark field" photomasks. For the sake of convenience and clarity, photomask 104 is depicted and described as being a "light field" photomask.

After photomask 104 is aligned, photomask 104 and portions of photoresist layer 100 are exposed to light. As depicted in FIG. 1, only certain portions of photoresist layer 100 are exposed to the light, i.e., the portions under portions 108 of photomask 104 that transmit light. As also depicted in FIG. 1, a lens 110 can be disposed between photomask 104 and photoresist layer 100 to focus the transmitted light.

Photoresist layer 100 has the material characteristic that its solubility is responsive to exposure to light. More particularly, some photoresist change from a soluble to an insoluble condition when exposed to light. These types of photoresist are generally known as "negatively acting" resist. In contrast, some photoresist change from an insoluble to a soluble condition when exposed to light. These types of photoresist are generally known as "positively acting" resist. For the sake of convenience and clarity, assume that photoresist layer 100 is a "positively acting" resist. As such, when photoresist layer 100 is exposed to an appropriate chemical solvent (i.e., a developer), the portions of photoresist layer 100 that were exposed to the light are dissolved.

When making photomask 104, it is desirable to determine the transmittance of photomask 104. For the purpose of this application, the term "transmittance" refers to a measurement of the amount of light transmitted through photomask 104 (i.e., an amplitude) and/or the associated phase shift that results in the light after being transmitted through photomask 104 (i.e., a phase shift). Stated another way, the term "transmittance" can be used to refer to only the amplitude without the phase shift, only the phase shift without the amplitude, or both the amplitude and the phase shift.

Conventionally, transmittance of photomask 104 is determined by actually measuring the amount of light transmitted through photomask 104 and/or the phase shift. This process, however, requires specialized equipment, which can be costly and time consuming to use.

SUMMARY

In one exemplary embodiment, transmittance of a photomask is determined using optical metrology. In particular, reflectance of a portion of the photomask is determined by directing an incident beam of light at the portion of the photomask. The reflectance is determined by measuring light diffracted from the portion of the photomask. One or more geometric features of the portion of the photomask are determined using the measured light diffracted from the portion of the photomask. A wave coupling is determined using the determined one or more geometric features of the portion of the photomask. The transmittance of the photomask is determined using the determined wave coupling and the determined reflectance of the portion of the photomask.

DESCRIPTION OF THE DRAWING FIGURES

The present application can be best understood by reference to the following description taken in conjunction with the accompanying drawing figures, in which like parts may be referred to by like numerals:

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
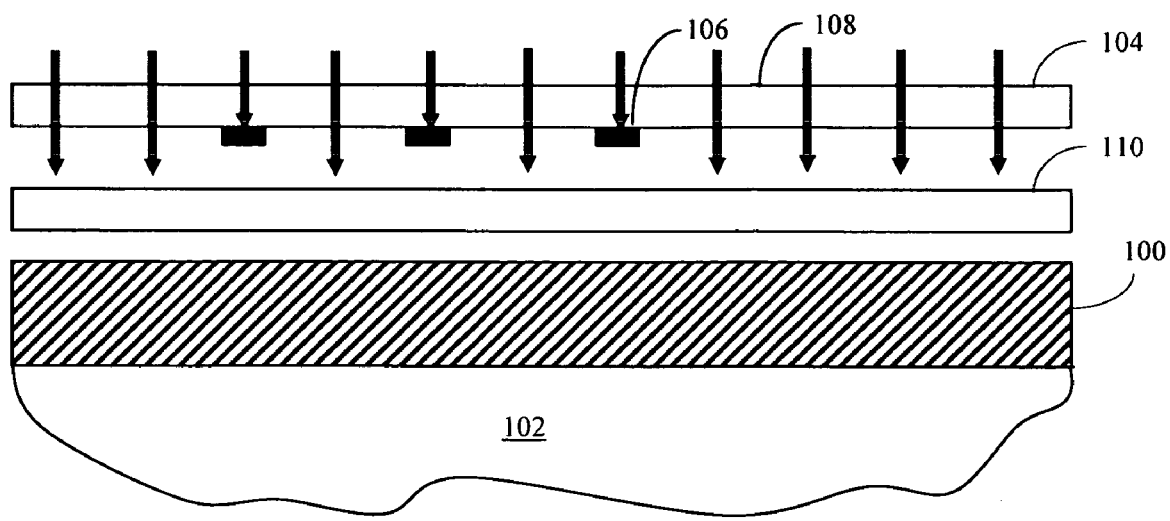
FIG. 1 depicts a prior art photomask.
Figure 2:
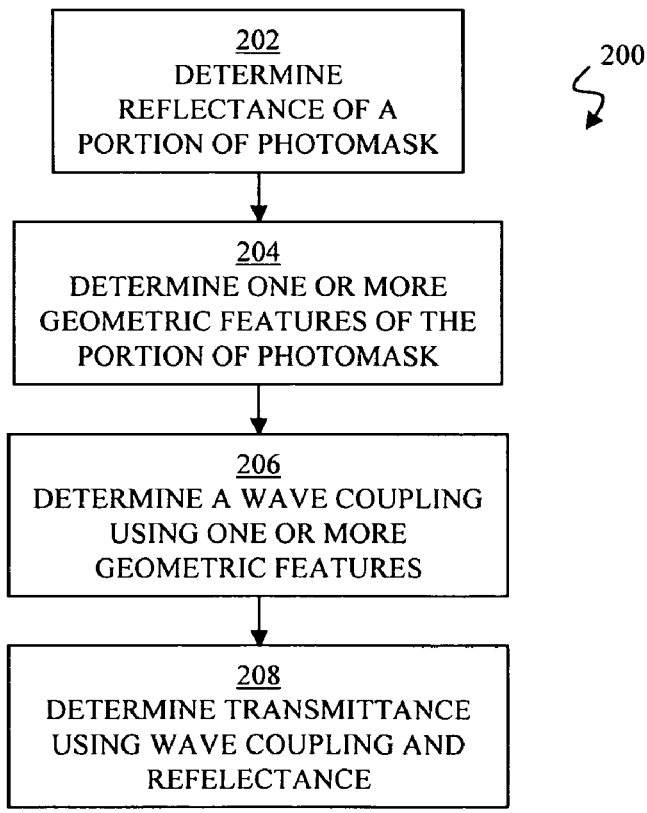
FIG. 2 depicts an exemplary process of determining transmittance of a photomask using optical metrology.

As noted above, it is desirable to determine the transmittance of a photomask. Thus, with reference to FIG. 2, an exemplary process 200 is depicted for determining the transmittance of a photomask using optical metrology.

In particular, in step 202, a reflectance of a portion of the photomask is determined by directing an incident beam of light at the portion of the photomask. The reflectance is determined by measuring light diffracted from the portion of the photomask. In one exemplary embodiment, the $0^{th}$ order diffraction, or the reflection, is measured. It should be recognized, however, that various orders of diffraction can be measured.

Figure 3:
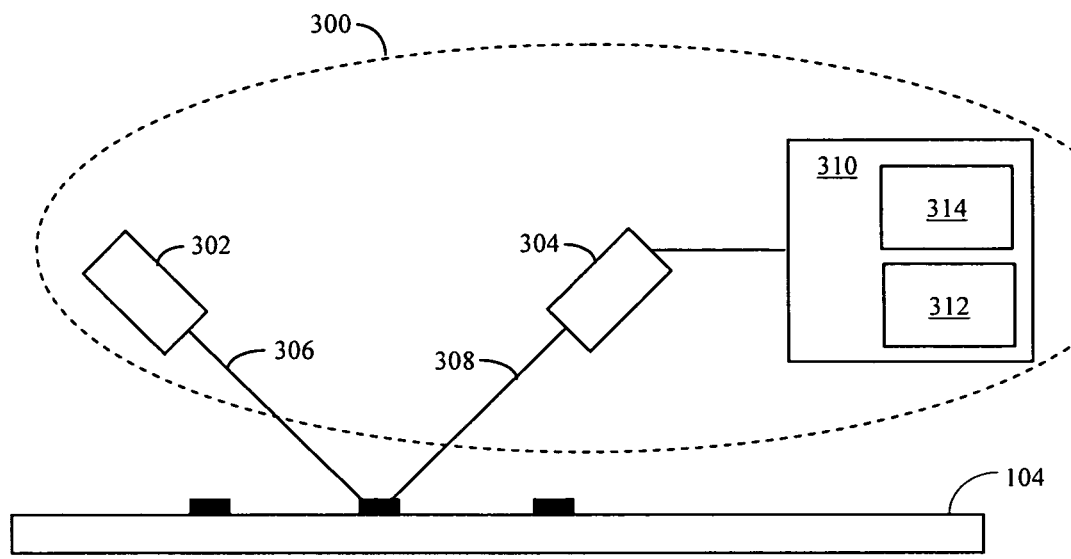
FIGS. 3 and 4 depict an exemplary optical metrology system.

For example, with reference to FIG. 3, an exemplary optical metrology system 300 is depicted. Optical metrology system 300 includes a source 302 and a detector 304. Source 302 is configured to direct an incident beam of light 306 at a portion of photomask 104. Photomask 104 can be a phase-shift photomask with a phase shifting material, such as molybdenum silicide (MoSi), or etched quartz. Alternatively, photomask 104 can be an alternating aperture phase shift mask. Detector 304 is configured to measure diffracted light 308 from the portion of photomask 104.

Figure 4:
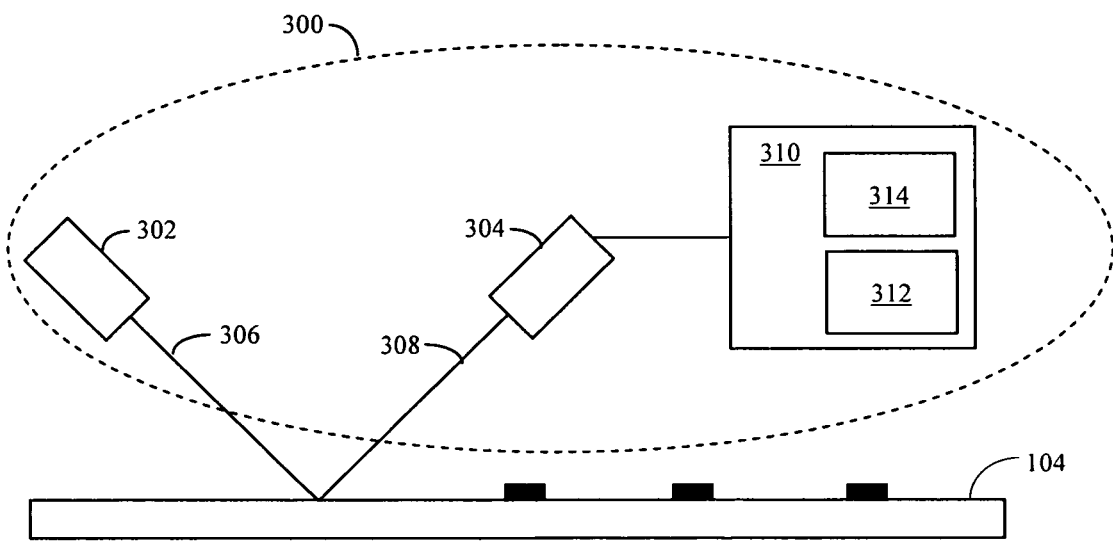

In FIG. 3, incident beam of light 306 is directed at a portion of photomask 104 that is a patterned area, such as an area having a grating structure. Although FIG. 3 depicts incident beam of light 306 directed at a single line of the grating structure, it should be recognized that incident beam of light 306 can have a field of view large enough to cover many lines of the grating structure. Also, with reference to FIG. 4, incident beam of light 306 can be directed at a portion of photomask 104 that is a thin film area, which is a portion of photomask 104 that does not have a patterned structure formed on it.

With reference again to FIG. 2, in step 204, one or more geometric features of the portion of the photomask can be determined using the measured light diffracted from the portion of the photomask. As noted above, the incident beam of light can be directed at a portion of the photomask that is a thin film area. In this case, the one or more geometric features can include the number of layers in the thin film area, the thickness of each layer in the thin film area, and the like. As also noted above, the incident beam of light can be directed at a portion of the photomask that is a patterned area, such as an area having a grating structure. In this case, the one or more geometric features can include one or more critical dimensions (e.g., bottom width, top width, height, etc.), duty cycle or periodicity, whether the grating structure is symmetric, and the like. The one or more features of a patterned area can also include the one or more geometric features of the thin film layers below the patterned area, such as number of layers, thickness of each layer, and the like.

For example, with reference again to FIG. 3, optical metrology system 300 includes a processing unit 310. Processing unit 310 is configured to determine one or more geometric features of the portion of photomask 104 on which incident beam 306 was directed using measured diffracted light from the portion of photomask 104. The one or more geometric features can be determined by obtaining a measured diffraction signal from the measured light diffracted from the portion of the photomask. A best-matching simulated diffraction signal can be determined by comparing the measured diffraction signal to one or more simulated diffraction signals. The one or more geometric features are determined based on one or more features of a hypothetical profile corresponding to the best-matching simulated diffraction signal.

In particular, in a library-based process, the measured diffraction signal is compared to a library of simulated diffraction signals. More specifically, each simulated diffraction signal in the library is associated with a hypothetical profile of the portion of the photomask. When a best-match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the portion of the photomask.

Thus, with reference again to FIG. 3, in one exemplary embodiment, after obtaining a measured diffraction signal, processing module 310 then compares the measured diffraction signal to simulated diffraction signals stored in a library 312. Each simulated diffraction signal in library 312 can be associated with a hypothetical profile. Thus, when a match is made between the measured diffraction signal and one of the simulated diffraction signals in library 312, the hypothetical profile associated with the matching simulated diffraction signal can be presumed to represent the actual profile of portion of the photomask.

For a more detailed description of a library-based process, see U.S. Pat. No. 6,943,900, titled GENERATION OF A LIBRARY OF PERIODIC GRATING DIFFRACTION SIGNALS, filed on Jul. 16, 2001, issued Sep. 13, 2005, which is incorporated herein by reference in its entirety.

In a regression-based process, the measured diffraction signal is compared to a simulated diffraction signal (i.e., a trial signal). The simulated diffraction signal is generated prior to the comparison using a set of profile parameters (i.e., trial profile parameters) for a hypothetical profile. If the measured diffraction signal and the simulated diffraction signal do not match or when the difference of the measured diffraction signal and one of the simulated diffraction signals is not within a preset or matching criterion, another simulated diffraction signal is generated using another set of profile parameters for another hypothetical profile, then the measured diffraction signal and the newly generated simulated diffraction signal are compared. When the measured diffraction signal and the simulated diffraction signal match or when the difference between the measured diffraction signal and one of the simulated diffraction signals is within a preset or matching criterion, the hypothetical profile associated with the matching simulated diffraction signal is presumed to represent the actual profile of the portion of the photomask.

Thus, with reference again to FIG. 3, the processing module 310 can generate a simulated diffraction signal for a hypothetical profile, and then compare the measured diffraction signal to the simulated diffraction signal. As described above, if the measured diffraction signal and the simulated diffraction signal do not match or when the difference between the measured diffraction signal and one of the simulated diffraction signals is not within a preset or matching criterion, then processing module 310 can iteratively generate another simulated diffraction signal for another hypothetical profile. The subsequently generated simulated diffraction signal can be generated using an optimization algorithm, such as global optimization techniques, which includes simulated annealing, and local optimization techniques, which includes steepest descent algorithm.

The simulated diffraction signals and hypothetical profiles can be stored in a library 312 (i.e., a dynamic library). The simulated diffraction signals and hypothetical profiles stored in library 312 can then be subsequently used in matching the measured diffraction signal.

For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, filed on Aug. 6, 2001, issued Aug. 31, 2004, which is incorporated herein by reference in its entirety.

As described above, simulated diffraction signals are generated to be compared to measured diffraction signals. The simulated diffraction signals can be generated by applying Maxwell's equations and using a numerical analysis technique to solve Maxwell's equations. It should be noted, however, that various numerical analysis techniques, including variations of rigorous coupled wave analysis (RCWA), can be used. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

The simulated diffraction signals can also be generated using a machine learning system (MLS) employing a machine learning algorithm, such as back-propagation, radial basis function, support vector, kernel regression, and the like. For a more detailed description of machine learning systems and algorithms, see "Neural Networks" by Simon Haykin, Prentice Hall, 1999, which is incorporated herein by reference in its entirety. See also U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

In one exemplary embodiment, the simulated diffraction signals in a library of simulated diffraction signals, such as library 312 (FIG. 3), used in a library-based process are generated using a MLS. For example, a set of hypothetical profiles can be provided as inputs to the MLS to produce a set of simulated diffraction signals as outputs from the MLS. The set of hypothetical profiles and set of simulated diffraction signals are stored in the library.

In another exemplary embodiment, the simulated diffraction signals used in a regression-based process are generated using a MLS, such as MLS 314 (FIG. 3). For example, an initial hypothetical profile can be provided as an input to the MLS to produce an initial simulated diffraction signal as an output from the MLS. If the initial simulated diffraction signal does not match the measured diffraction signal, another hypothetical profile can be provided as an additional input to the MLS to produce another simulated diffraction signal.

FIG. 3 depicts processing module 310 having both a library 312 and MLS 314. It should be recognized, however, that processing module 310 can have either library 312 or MLS 314 rather than both. For example, if processing module 310 only uses a library-based process, MLS 314 can be omitted. Alternatively, if processing module 310 only uses a regression-based process, library 312 can be omitted. Note, however, a regression-based process can include storing hypothetical profiles and simulated diffraction signals generated during the regression process in a library, such as library 312.

With reference again to FIG. 2, after the one or more features of the portion of the photomask have been determined, in step 206, a wave coupling is determined using the determined one or more geometric features. In particular, for a given shape, which includes one or more geometric features, a wave coupling can be generated using known techniques, such as rigorous coupled-wave analysis (RCWA), finite difference time domain (FDTD), Green's function algorithm, and the like.

For example, in RCWA, the light propagation in a geometric shape is calculated rigorously after staircase approximation on the geometric shape along the normal direction of the mask surface, and truncate the Fourier expansion series parallel to the mask surface. In this formulism, the wave coupling is expressed by the energy conversion between various Fourier components of the electro-magnetic field in the geometric shape. The behavior of the energy conversion follows a set of coupling wave equations, which is solved rigorously. After the coupling wave equation is solved rigorously, the behavior of light propagation inside the geometric shape is characterized. Since the light propagation behavior inside the geometric shape is characterized rigorously, the light diffracted at far field by the geometric shape can be calculated, both in the same side and opposite side of incident. Indeed, the calculation can be carried out at the same time, and the simulated diffraction signal in the incident side (reflection side) can be used for best matching the measured diffraction signal to determine the geometric shape and transmittance. See also, L. Li, "Note on the S-matrix Propagation Algorithm," J. Opt. Soc. Am. A, Vol. 30, No. 4, pp 655-660 (2003), which is incorporated herein by reference in its entirety.

As described above, in one exemplary embodiment, in addition to the one or more geometric features of the portion of the photomask, the wave coupling is determined using an optical property of the portion of the photomask. When used in a lithographic process, the photomask is exposed using a predetermined wavelength of light, which is commonly referred to as the exposure wavelength. The typical exposure wavelength is currently about 193 nanometers. It should be recognized, however, that various exposure wavelengths may be used. In particular, as feature sizes decrease, the exposure wavelength is also likely to decrease.

In the present exemplary embodiment, the optical property of the portion of the photomask used to determine the wave coupling is the optical property of the portion of the photomask at the predetermined wavelength of light (i.e., the exposure wavelength). Thus, if the exposure wavelength is about 193 nanometers, then the optical property used in determining the wave coupling is the optical property of the portion of the photomask at about 193 nanometers. For example, the optical property can include refractive index (n) and extinction coefficient (k), which are commonly referred to collectively as n & k. If the exposure wavelength of the photomask is about 193 nanometers, then the n & k values of the portion of the photomask at about 193 nanometers is used.

As described above, the reflectance is determined by directing an incident beam of light at the portion of the photomask. The incident beam of light includes a range of wavelength of light. In the present exemplary embodiment, the predetermined wavelength of light to be used to expose the photomask is outside the range of wavelength of light of the incident beam of light. Thus, the optical property, such as n & k values, of the portion of the photomask used to determine the wave coupling can be at a wavelength that is outside of the range of wavelengths of light of the incident beam of light directed at the portion of the photomask. For example, the range of wavelength of light of the incident beam of light can be between about 200 to about 800 nanometers. The predetermined wavelength of light to be used to expose the photomask is about 193 nanometers. Thus, the optical property, such as n & k values, of the portion of the photomask used to determine the wave coupling is about 193 nanometers, which is outside the range of about 200 to about 800 nanometers.

With reference again to FIG. 2, in step 208, the transmittance of the photomask is determined using the determined wave coupling and the determined reflectance of the portion of the photomask. As noted above, in determining the transmittance, only a measure of the amount of transmitted light (i.e., amplitude of the transmittance) can be determined without determining the phase shift. Alternatively, both the amplitude and the associate phase shift can be determined in determining the transmittance.

In one exemplary embodiment, the portion of the photomask being examined by the incident beam of light includes a periodic structure. Thus, interferences are produced in the light diffracted from the periodic structure (i.e., destructive interference for most directions, and constructive interference in discrete directions). The interferences can be sorted as orders, both in incident side and transmission side, such as at 0 order, +1 order, −1 order, +1 order, −2 order, and the like. Understanding the behavior of light with respect to a periodic structure is much easier/simpler than with respect to a non-periodic structure. However, it should be recognized that a non-periodic structure can be used, and that understanding the behavior of light with respect to a periodic structure provides information can be used to analyze the behavior of light with respect to the non-periodic structure.

Light is a polarized electro-magnetic (EM) wave, and the diffraction behavior of the light is dependent to its polarization state. EM wave is a transverse wave, i.e., only two independent polarization directions for a given propagation direction. Mathematically, these directions can be defined as transverse-electric (TE) polarization and/or transverse-magnetic (TM) polarization, where for TE field the electric field is perpendicular to the incident plan, and for TM field the magnetic field is perpendicular to the incident plan. For a periodic structure, when the incident plan is parallel to the period direction, the TE field and TM filed diffract independently, i.e., TE will only couple to TE, and TM only diffract to TM model. If the incident plan is not parallel to the periodic directions, or the geometric feature is periodic in two directions, i.e., 2-dimensional matrices, TE wave can be diffracted into TE and TM mode, and so does the TM wave. Thus, the diffraction behavior is characterized by 4 complex parameters, namely, $r_{ss}$, $r_{sp}$, $r_{ps}$, $r_{pp}$ and $t_{ss}$, $t_{sp}$, $t_{ps}$, $t_{pp}$. $r_{ps}$, and $r_{sp}$, is known as cross polarization terms. All of the parameters are complex vector. Each element of the vector corresponds to a diffraction order. All of the parameters can be the output of a wave coupling calculation, e.g., RCWA, FDTD, Green's function algorithm, and the like.

Although exemplary embodiments have been described, various modifications can be made without departing from the spirit and/or scope of the present invention. Therefore, the present invention should not be construed as being limited to the specific forms shown in the drawings and described above.

We claim:

1. A method of determining a transmittance of a photomask for an exposure wavelength using an optical metrology system, the optical metrology system using an incident beam with a range of wavelengths, the method comprising:
    measuring a diffraction signal off a portion of a photomask, the diffraction signal generated by directing an incident beam with a range of wavelengths onto the portion of the photomask;
    determining one or more geometric features of the photomask using the measured diffraction signal off the portion of the photomask;
    determining one or more optical properties of the portion of the photomask using the determined one or more geometric features and an exposure wavelength;
    determining a wave coupling of the of the portion of the photomask using the determined one or more optical properties of the portion of the photomask at the exposure wavelength; and
    determining the transmittance of the portion of the photomask at the exposure wavelength.

2. The method of claim 1 wherein the exposure wavelength is 193 nanometers and the range of wavelengths of the incident beam is between about 200 and about 800 nanometers.

3. The method of claim 1 wherein the one or more geometric features of the photomask includes critical dimensions (e.g., bottom width, top width, height, etc.), duty cycle or periodicity, whether the grating structure is symmetric, and/or thickness of the layers in the portion of the photomask.

4. The method of claim 1 wherein the one or more optical properties of the portion of the photomask include refractive index (n) and extinction coefficient (k) at the exposure wavelength.

5. The method of claim 1 wherein the portion of the photomask is a thin film area or includes a grating structure.

6. The method of claim 1 wherein the transmittance comprises:
    determining a measure of the amount of light transmitted through the portion of the photomask without determining phase shift.

7. The method of claim 1 wherein determining the transmittance comprises:
    determining a measure of the amount of light transmitted through the portion of the photomask and phase shift.

8. The method of claim 1 wherein the transmittance is determined for a plurality of orders of diffraction.

9. The method of claim 1, wherein the transmittance is determined for transverse-electric (TE) polarization and transverse-magnetic (TM) polarization.

10. The method of claim 1, wherein determining one or more geometric features comprises:
    determining a best-matching simulated diffraction signal by comparing the measured diffraction signal to one or more simulated diffraction signals; and
    determining the one or more geometric features based on one or more features of a hypothetical profile corresponding to the best-matching simulated diffraction signal.

11. A system to determine a transmittance of a photomask for an exposure wavelength using an optical metrology system, the optical metrology system using an incident beam with a range of wavelengths, the system comprising:
    a source configured to direct an incident beam with a range of wavelengths of light at a portion of the photomask;
    a detector configured to receive and measure light diffracted from the portion of the photomask;
    a processing module configured to:
    determine one or more geometric features of the photomask using the measured diffraction signal off the portion of the photomask;
    determine one or more optical properties of the portion of the photomask using the determined one or more geometric features and an exposure wavelength;
    determine a wave coupling of the of the portion of the photomask using the determined one or more optical properties of the portion of the photomask at the exposure wavelength; and
    determine the transmittance of the portion of the photomask at the exposure wavelength;
    the photomask.

12. The system of claim 11 wherein the exposure wavelength is 193 nanometers and the range of wavelengths of the incident beam is between about 200 and about 800 nanometers.

13. The system of claim 11 wherein the one or more geometric features of the photomask includes critical dimensions (e.g., bottom width, top width, height, etc.), duty cycle or periodicity, whether the grating structure is symmetric, and/or thickness of the layers in the portion of the photomask.

14. The system of claim 11 wherein the one or more optical properties of the portion of the photomask include refractive index (n) and extinction coefficient (k) at the exposure wavelength.

15. The system of claim 11 wherein the portion of the photomask is a thin film area or includes a grating structure.

16. The system of claim 11 wherein determining the transmittance comprises:
    determining a measure of the amount of light transmitted through the portion of the photomask without determining phase shift.

17. The system of claim 11 wherein determining the transmittance comprises:
    determining a measure of the amount of light transmitted through the portion of the photomask and phase shift.

18. The system of claim 11 wherein the transmittance is determined for a plurality of orders of diffraction.

19. The system of claim 11, wherein the transmittance is determined for transverse-electric (TE) polarization and transverse-magnetic (TM) polarization.

20. The system of claim 11, wherein determining one or more geometric features comprises:
    determining a best-matching simulated diffraction signal by comparing the measured diffraction signal to one or more simulated diffraction signals; and
    determining the one or more geometric features based on one or more features of a hypothetical profile corresponding to the best-matching simulated diffraction signal.

* * * * *